United States Patent
Schofield

(10) Patent No.: US 7,619,552 B1
(45) Date of Patent: Nov. 17, 2009

(54) LOW DISTORTION CURRENT SWITCH

(75) Inventor: William George John Schofield, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/108,996

(22) Filed: Apr. 24, 2008

(51) Int. Cl.
*H03M 1/66* (2006.01)

(52) U.S. Cl. ........................... 341/144; 341/136

(58) Field of Classification Search ......... 341/136, 341/144
See application file for complete search history.

(56) References Cited

U.S. PATENT DOCUMENTS

| | | | |
|---|---|---|---|
| 6,344,816 B1 | 2/2002 | Dedic | |
| 6,664,906 B2 * | 12/2003 | Volk | 341/118 |
| 6,768,438 B1 * | 7/2004 | Schofield et al. | 341/144 |
| 6,960,941 B2 * | 11/2005 | Cantin et al. | 327/57 |
| 6,992,608 B2 * | 1/2006 | Zhang et al. | 341/144 |
| 7,474,243 B1 * | 1/2009 | Kuttner | 341/144 |

* cited by examiner

*Primary Examiner*—Khai M Nguyen
(74) *Attorney, Agent, or Firm*—Kenyon & Kenyon LLP

(57) ABSTRACT

A system and method is provided for code independent switching in a digital-to-analog converter (DAC). A synchronous digital circuit is triggered by a synchronizing clocking signal and develops a digital data signal. A circuit arrangement provides the synchronizing clock a constant load at every clocking cycle, thereby assuring a data independent load. By providing a data independent load to the synchronizing clock at every clocking cycle, third harmonic distortion is advantageously reduced.

10 Claims, 4 Drawing Sheets

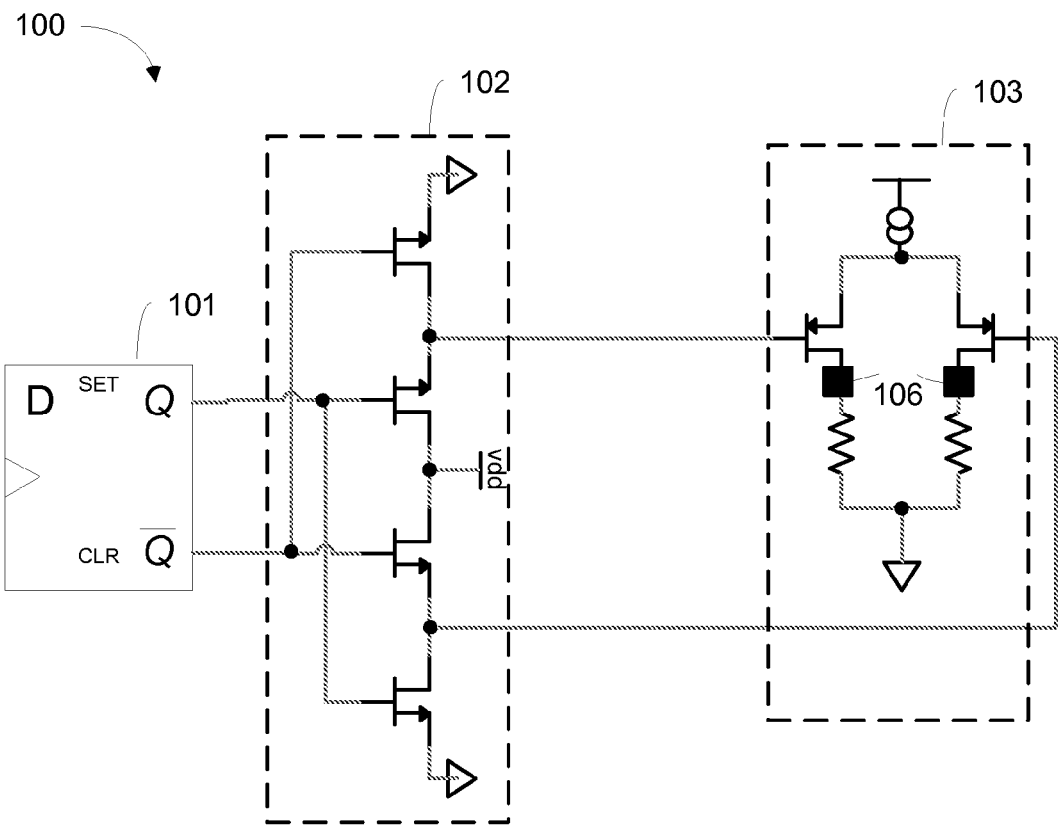
Figure 1: Prior Art
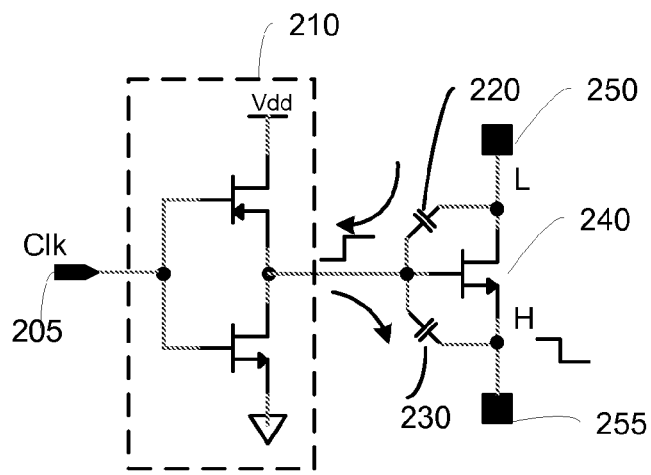
Figure 2: Prior Art

NAND SR Flip-Flop Truth Table

| S | R | Q | Q' | |
|---|---|---|---|---|
| 1 | 0 | 0 | 1 | |
| 1 | 1 | 0 | 1 | (after S=1, R=0) |
| 0 | 1 | 1 | 0 | |
| 1 | 1 | 1 | 0 | (after S=0, R=1) |
| 0 | 0 | 1 | 1 | |

NOR SR Flip-Flop Truth Table

| S | R | Q | Q' | |
|---|---|---|---|---|
| 1 | 0 | 1 | 0 | |
| 0 | 0 | 1 | 0 | (after S=1, R=0) |
| 0 | 1 | 0 | 1 | |
| 0 | 0 | 0 | 1 | (after S=0, R=1) |
| 1 | 1 | 0 | 0 | |

US 7,619,552 B1

LOW DISTORTION CURRENT SWITCH

COPYRIGHT AND LEGAL NOTICES

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

BACKGROUND INFORMATION

The present invention relates in general to electronic signal processing, and more specifically, to digital to analog signal conversion.

A current steering digital-to-analog converter (DAC) converts a digital data stream input into a corresponding analog signal output. FIG. 1 shows a portion of a typical current steering DAC 100 in which a digital data stream is applied to a synchronous digital output latch 101. "Synchronous" means that the data on the latch input is transferred to the output in response to triggering of the latch by a clocking signal. In some applications, considerable digital processing is involved in producing such a digital data stream, but in the context of a DAC, such preceding digital circuitry need not be described. When the latch 101 is clocked, the data present on the D-input is transferred to the Q output, and its complement is transferred to the Q-bar output.

The outputs of latch 101 asynchronously control switch drivers 102, which in turn control differential switching elements 103. "Asynchronously" means that the logic state of the outputs of the switch drivers 102 and the differential switching elements 103 change state in response to their inputs changing state rather than in response to a clocking signal. For a given logic state present on the output of the latch 101, one switch of the differential switching elements 103 will be "ON," and the other will be "OFF". When the logic state on the output latch 101 changes, the ON-OFF states of the differential switching element 103 provide an analog signal at output terminals 106.

In theory, such a current steering DAC 100 can operate at any frequency to provide an analog output corresponding to the digital data input. In practice, errors and noise occur throughout the system, the effects of which increase with operating frequency. These effects may be code dependent and may result in harmonic distortion and harmonic spurs in the analog output signal.

A current switching DAC may employ multiple current switching elements. If each individual switching element is clocked from the same clock buffer, which may be desirable to minimize switching instant mismatch, the clock buffer may see a load dependent upon the number of elements switching. As the number of elements switching is related to the signal being processed, the clock may see a signal dependent load. Consequently, there may be a signal dependent clocking instant, resulting in third order distortion.

For example, FIG. 2 illustrates a clock driver 210 connected to switching element 240 which may be a PFET or an NFET. When clock input 205 changes state, for example from high to low, the output of the driver 210 will change from low to high, thereby turning "ON" switching element 240. Switching element 240 has inherent coupling capacitance 220 between the gate to drain and coupling capacitance 230 between gate to source. Thus, due to coupling, the clock driver 210 is dependent on the data that is on nodes 250 and 255. For example there is a difference in the current flowing into and out of the clock driver 210 when the data between node 250 and node 255 is changing and when the data is not changing. This difference in load, seen by clock driver 210, based on the data on nodes 250 and 255 introduces third order harmonic distortion, which is not desirable.

One approach to reducing code dependent noise is presented in FIG. 8 of U.S. Pat. No. 6,344,816, which describes adding an additional clocked circuit called a "dummy latch" in parallel with the output latch 101. The output of the dummy latch is not itself used in any way, rather the dummy latch and the output latch 101 are connected and operated such that with every cycle of the clocking signal, one of the latches will change state and the other will not. Thus, if the output latch 101 changes state with the data signal, the dummy latch maintains its logic state, and if the output latch 101 maintains its logic state constant with an unchanging data signal, then the dummy latch will change logic states. However, the attempt to equalize the loading to the clock by the addition of dummy latches and the corresponding support circuitry, may add to the overall complexity, overhead, mismatch, power consumption, and size of the implementation.

Thus, there is a need for an efficient system and method for a low distortion current switch, which ensures that the load seen by the clock buffer is the same in every clocking cycle, while achieving low third harmonic distortion.

BRIEF DESCRIPTION OF THE DRAWINGS

The invention is illustrated in the figures of the accompanying drawings, which are meant to be exemplary and not limiting, and in which like references are intended to refer to like or corresponding parts.

FIG. 1 shows a portion of a typical current steering DAC.

FIG. 2 shows an example of the data dependent load that a clocking driver may see.

DETAILED DESCRIPTION

Figure 3A:
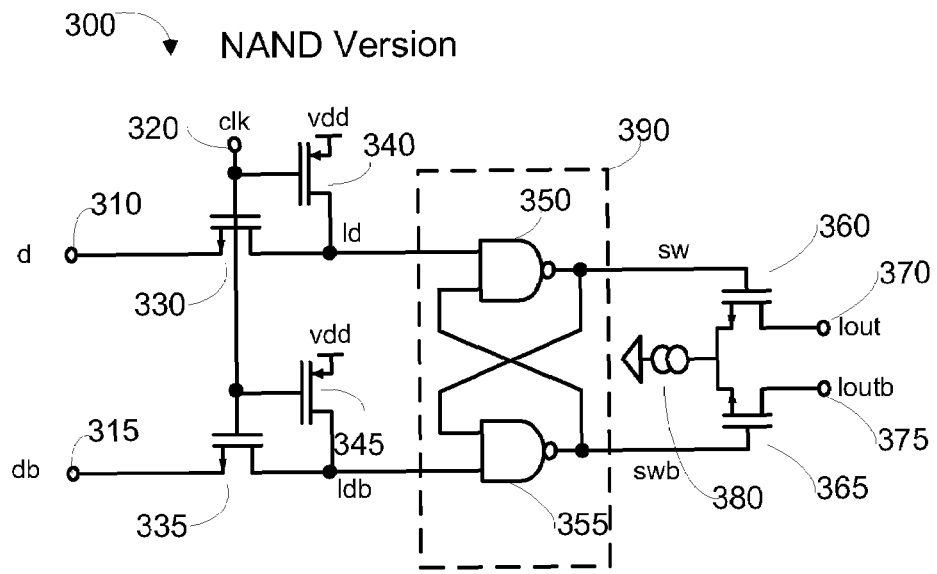
FIG. 3a shows a digital control circuitry with a NAND implementation of the SR latch in accordance with an embodiment of the invention.

A system and method are provided for making the load of the clock driver independent of data, thereby reducing third order harmonic distortion. FIG. 3a shows a digital control circuitry with a NAND implementation of an SR latch in accordance with an embodiment of the invention. Such architecture may comprise a data input 310 and a complementary input 315, clock input 320, pre-charging switches 340 and 345, an SR Latch 390, comprising NAND gates 350 and 355, and complementary current outputs 370 and 375, controlled by switches 360 and 365 which may be supplied by current source 380. Switching elements 330 and 335 are coupled to data inputs 310 and 315 accordingly. When turned "ON," switching elements 330 and 335 provide a path to the SR Latch 390 comprising NAND gates 350 and 355. In one embodiment, switching elements 330 and 335 may be NFETS. The gates of the switching elements 330 and 335 are controlled by clocking signal 320. When the clock is "high," data from input 310 and complementary input 315 is passed through switching devices 330 and 335 to NAND 350 and 355 respectively. When the clock is "low," data input 310 and complementary input 315 is prevented to pass through switching devices 330 and 335. Further, when the clock is "low," switching devices 340 and 345 pre-charge node Id and Idb to "high" respectively. In one embodiment, switching devices 340 and 345 are PFETs. Thus, when the clock is "low," both input nodes Id and Idb to the SR Latch 390 are at "high." When the clock is "high," data input 310 and complementary input 315 is passed to the input nodes Id and Idb, respectively, becoming the inputs to the SR Latch 390.

The latch 390 is a basic SR latch comprising two cross-coupled NAND gates 350 and 355. The input to NAND 350 is signal Id and the output of NAND 355 (signal swb). Similarly, the input of NAND 355 is Idb and the output of NAND 350 (signal sw). Outputs sw and swb are complements of each other. The NAND embodiment of the SR latch 390 "holds" the data stored in the SR latch 390 when inputs Id and its complement Idb are forced to "high" during the pre-charge state. The SR latch 390 is "reset" when Id input is "high" and the complementary input Idb is "low." The "reset" forces output of NAND 350 (signal sw) to go to "low" while the complementary output at the output of NAND 355 (signal swb) goes to "high." This situation may arise when the clock input 320 is "high," and, thus, not in the pre-charge state, and the data from input 310 is "high" while complementary input 315 is "low." Alternatively, the SR latch 390 is "set" when Id input is "low" and the complementary input Idb is "high." The "set" forces output of NAND 350 (signal sw) to go to "high" while the complementary output at the output of NAND 355 (signal swb) goes to "low." This situation may arise when the clock input 320 is "high," and, thus, not in the pre-charge state, and the data from input 310 is "low" while complementary input 315 is "high." FIG. 4 offers a truth table that summarizes the operation of a NAND configured SR latch 390. The "set" column S, corresponds to input Id while the "reset" input R, corresponds to the complementary input Idb. Outputs Q and Q' of the table correspond to signals sw and the complementary signal swb respectively. Thus, during the pre-chare state, S=1 (high) and R=1 (high), the outputs Q and Q' "hold" the previous information stored in the SR latch 390. State S=0 (low), R=0 (low) is a forbidden state. Since the inputs to the SR latch 390 are either S=1 and R=1 during pre-charge or, when not in pre-charge, are complementary, state S=0, R=0 does not occur in the embodiment shown in configuration 300 of FIG. 3a.

In one embodiment, the output of the SR latch 390 may be coupled to differential switching elements 360 and 365, as illustrated in FIG. 3a. Current source 380 may be coupled to ground and provide the current for switching elements 360 and 365. When sw is "high," the complementary signal swb is "low," turning "ON" switch 360 while turning "OFF" switch 365. Thus, the current from current source 380 flows substantially through switch 360 and output Iout, 370. Alternatively, if sw is "low," the complementary signal swb is "high," turning "OFF" switch 360 while turning "ON" switch 365. Now, the current from current source 380 flows substantially through switch 365 and output Ioutb, 375. Switches 360 and 365 may be FETs or bipolar devices. In the preferred embodiment of FIG. 3a, switches 360 and 380 are NFETs.

Figure 3B:
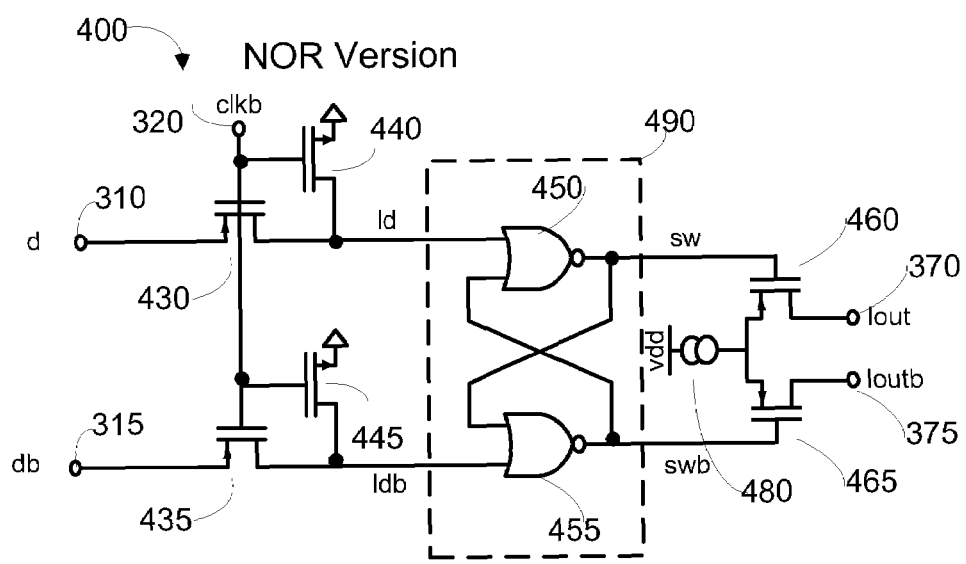
FIG. 3b shows a digital control circuitry with a NOR implementation of the SR latch in accordance with an embodiment of the invention.

Those skilled in the art will readily understand that the concepts described above can be applied with different devices and configurations. For example, FIG. 3b illustrates digital control circuitry with a NOR implementation of the SR latch in accordance with an embodiment of the invention. Such architecture may comprise a data input 310 and a complementary input 315, clock input 320, pre-charging switches 440 and 445, an SR Latch 490, comprising NOR gates 450 and 455, and complementary current outputs 370 and 375, controlled by switches 460 and 465 which may be supplied by current source 480. Switching elements 430 and 435 are coupled to data inputs 310 and 315 respectively. When turned "ON," switching elements 430 and 435 provide a path to the SR Latch 490 comprising NOR gates 450 and 455. In one embodiment, switching elements 430 and 435 may be PFETS. The gates of the switching elements 430 and 435 are controlled by clocking signal 320. When the clock is "low," data from input 310 and complementary input 315 is passed through switching devices 430 and 435 to NOR 450 and 455 respectively. When the clock is "high," data input 310 and complementary input 315 is prevented to pass through switching devices 430 and 435. Further, when the clock is "high," switching devices 440 and 445 pre-charge node Id and Idb to "low" respectively. In one embodiment, switching devices 440 and 445 are NFETs. Thus, when the clock is "low," both input nodes Id and Idb to the SR Latch 490 are at "low." When the clock is "low," data input 310 and complementary input 315 is passed to the input nodes Id and Idb, respectively, to the SR Latch 490.

The latch 490 is a basic SR latch comprising two cross-coupled NOR gates 450 and 455. The input to NOR 450 is signal Id and the output of NOR 455 (signal swb). Similarly, the input of NOR 455 is signal Idb and the output of NOR 450 (signal sw). As in the NAND configuration, the outputs sw and swb are complements of each other.

The NOR embodiment of the SR latch 490 "holds" the data stored in the SR latch 490 when inputs Id and its complement Idb are forced to "low" during the pre-charge state. The SR latch 490 is "reset" when Id input is "high" and the complementary input Idb is "low." The "reset" forces output of NOR 450 (signal sw) to go to "low" while the complementary output at the output of NOR 455 (signal swb) goes to "high." This situation may arise when the clock input 320 is "low," and, thus, not in the pre-charge state, and the data from input 310 is "high" while complementary input 315 is "low." Alternatively, the SR latch 490 is "set" when Id input is "low" and the complementary input Idb is "high." The "set" forces output of NOR 450 (signal sw) to go to "high" while the complementary output at the output of NOR 455 (signal swb) goes to "low." This situation may arise when the clock input 320 is "low," and, thus, not in the pre-charge state, and the data from input 310 is "low" while complementary input 315 is "high." FIG. 4b offers a truth table that summarizes the operation of a NOR configured SR latch 490. The "set" column S, corresponds to input Idb while the "reset" input R, corresponds to the complementary input Id. Outputs Q and Q' of the table correspond to signals sw and the complementary signal swb accordingly. Thus, during the pre-chare state, S=0 (low) and R=0 (low), the outputs Q and Q' "hold" the previous information stored in the SR latch 390. State S=1 (high), R=1 (high) is a forbidden state. Since the inputs to the SR latch 490 are S=0 and R=0 during pre-charge, or, when not in pre-charge, are complementary, state S=0, R=0 does not occur in configuration 400 of FIG. 3b.

In one embodiment, the output of the SR latch 490 may be coupled to differential switching elements 460 and 465, as illustrated in FIG. 3b. Current source 480 may be coupled to vdd and provides the current for switching elements 460 and 480. When sw is "high," the complementary signal swb is "low," turning "ON" switch 465 while turning "OFF" switch 460. Thus, the current from current source 480 flows substantially through switch 465 and output Ioutb, 375 in such a situation. Alternatively, if sw is "low," the complementary signal swb is "high," turning "OFF" switch 465 while turning "ON" switch 460. Now, the current from current source 480 flows substantially through switch 460 and output Iout, 470. Switches 460 and 465 may be FETs or bipolar devices. In the preferred embodiment of FIG. 3b, switches 460 and 480 are PFETs.

As provided for in the above description of the RS latch, which may be, for example, NAND configuration 390 or NOR configuration 490, there is a condition where if both inputs Id and Idb are at the same logic state, the outputs of the RS latch (390 or 490) will "hold" state. This may be achieved, for example, through pre-charging input nodes Id and Idb to the same logic state, which may be "high" for a NAND configured RS latch 390 or "low" for a NOR configured RS latch 490. The RS latch changes state when either of the inputs Id or Idb is taken to the opposite level. Data input d (310) and its complement db (315) to the SR latch is each in series with a switch, controlled by the clock signal 320. When the switches are "OFF" the inputs Id and Idb to the SR latch (390 or 490) are pre-charged to a level that would induce the RS latch (390 or 490) to a "hold" state. When the clock signal 320 turns "ON" the series switches, there will only be a single data transition, regardless of the previous data held by the RS latch (390 or 490). This ensures that the clock driver only sees a single data transition every clock cycle. Therefore, the clock driver is independent of the data signals 310 and 315, thereby reducing third order harmonic distortion.

Figures 4A, 4B, 5:
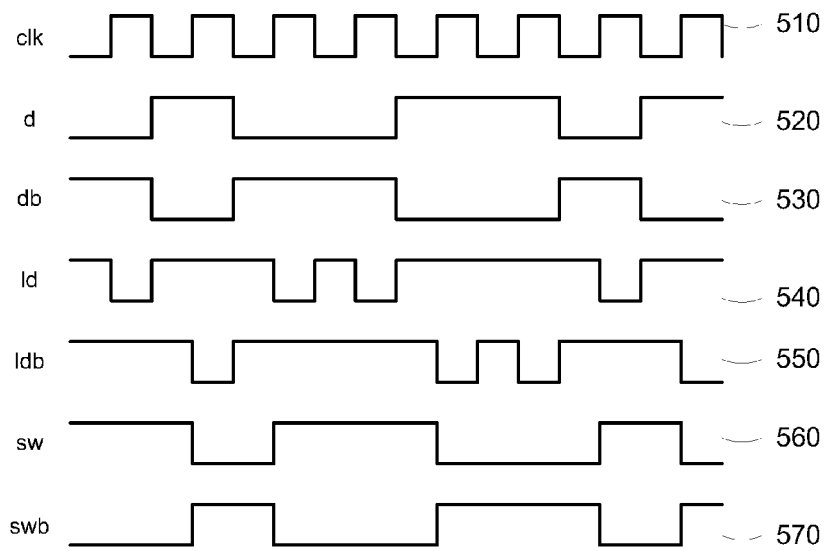
FIG. 4a shows a truth table for a NAND implementation of an SR latch.
FIG. 4b shows a truth table for a NOR implementation of an SR latch.
FIG. 5 shows exemplary waveforms related to the digital control circuitry with a NAND implementation of the SR latch in accordance with an embodiment of the invention.

FIG. 5 shows exemplary waveforms associated with the digital control circuitry of FIG. 3a in accordance with an embodiment of the invention. Signal 510 represents the clock signal that controls the series switches 330 and 335, as well as pre-charge switches 340 and 345 of FIG. 3a. Signals 520 and 530 are the complementary data inputs d and db, each in series with switches 340 and 345 respectively. Signals Id (540) and Idb (550), are "high" when clock signal 510 is "low," and thus in a pre-charge state. When the clock is "high," the signal d (520) is forced onto Id (540) while the signal db (530) is forced onto Idb (550). Signals sw (560) and swb (570) are the complementary outputs of the NAND SR latch 390. When the signals Id (540) and Idb (550) are "high," the data in the latch is held. When signal Id (540) is "high" while signal Idb (550) is "low," the data is reset, forcing sw (560) to "low" and its complementary signal swb (570) to "high." On the other hand, when signal Id (540) is "low" while signal Idb (550) is "high," the data is set, forcing sw (560) to "high" and its complementary signal swb (570) to "low."

Figure 6A:
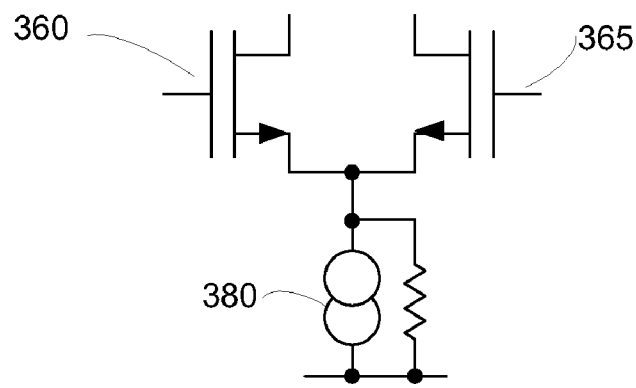
FIG. 6a shows a complementary current switch configuration as may be used with an embodiment of the invention.
Figure 6B:
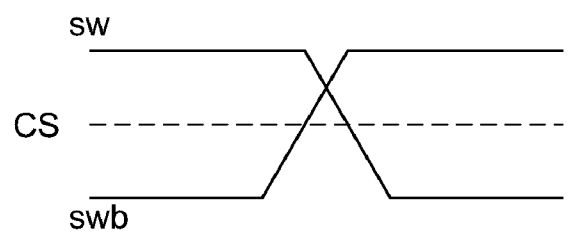
FIG. 6b shows input waveforms which may prevent crossover distortion in accordance with an embodiment of the invention.

One inherent benefit in using an SR latch configuration is that it reduces cross-over distortion. For example, FIG. 6a shows closer view of the complementary current switch configuration of FIG. 3a, as may be used in an embodiment of the invention. A linear sweep from "high" to "low" of signal sw at the gate of switch 360 and a proportional sweep of "low" to "high" of signal swb at the gate of switch 365, where both sw and swb signals are equal in magnitude at the cross-over point, may create a dead-band region, where both switches 360 and 365 are "OFF," which is undesirable. However, as illustrated in FIG. 6b, the output of an SR latch inherently has a crossover which is about a threshold voltage above the common mode, CS, of the sw and swb signals. This high cross-over prevents dead-band, which assures smooth current transition from one switch to the other, for example switch 360 to 365, thereby preventing crossover distortion.

Although the present invention has been described with reference to particular examples and embodiments, it is understood that the present invention is not limited to those examples and embodiments. The present invention as claimed, therefore, includes variations from the specific examples and embodiments described herein, as will be apparent to one of skill in the art. Accordingly, it is intended that the invention be limited only in terms of the appended claims.

What is claimed is:

1. A complementary digital control circuitry for a DAC comprising:
    a synchronous digital circuit triggered by a clocking signal and providing at least one digital output signal;
    a first input for receiving a digital signal;
    a second input for receiving a complement of said digital signal;
    an SR latch for storing the digital signal and the complement digital signal received at said first input and said second input, respectively; and
    a plurality of switching elements arranged so that said clocking signal drives a load substantially independently of the state of said first input and said second input, reducing third harmonic distortion.

2. The circuitry according to claim 1, wherein said first input and said second input are pre-charged to the same predetermined logic level.

3. The circuitry according to claim 1, wherein said SR latch includes a plurality of NAND gates.

4. The circuitry according to claim 1, wherein said SR latch includes a plurality of NOR gates.

5. The circuitry according to claim 1, wherein said DAC is a current mode DAC.

6. The circuitry according to claim 1, wherein said load is the same in every clocking cycle.

7. A method of signal processing comprising:
    pre-charging a first input and a second input to the same predetermined logic level;
    receiving a digital signal at said first input;
    receiving a complement of said digital signal at said second input; and
    providing complementary digital signals with a synchronous digital circuit triggered by a clocking signal, wherein a plurality of switching elements are arranged such that said clocking signal has a load of a constant number of said switching elements changing conduction state with every cycle of said clocking signal, reducing third harmonic distortion.

8. The method according to claim 7, wherein said synchronous digital circuit includes an SR latch.

9. The method according to claim 8, wherein said SR latch includes a plurality of NAND gates.

10. The method according to claim 8, wherein said SR latch includes a plurality of NOR gates.

* * * * *